United States Patent
Sumiya et al.

(10) Patent No.: US 8,853,828 B2
(45) Date of Patent: Oct. 7, 2014

(54) EPITAXIAL SUBSTRATE FOR SEMICONDUCTOR DEVICE, METHOD FOR MANUFACTURING EPITAXIAL SUBSTRATE FOR SEMICONDUCTOR DEVICE, AND SEMICONDUCTOR DEVICE

(75) Inventors: Shigeaki Sumiya, Handa (JP); Makoto Miyoshi, Inazawa (JP); Tomohiko Sugiyama, Nagoya (JP); Mikiya Ichimura, Ichinomiya (JP); Yoshitaka Kuraoka, Anjo (JP); Mitsuhiro Tanaka, Handa (JP)

(73) Assignee: NGK Insulators, Ltd., Aichi (JP)

(*) Notice: Subject to any disclaimer, the term of this patent is extended or adjusted under 35 U.S.C. 154(b) by 447 days.

(21) Appl. No.: 13/353,759

(22) Filed: Jan. 19, 2012

(65) Prior Publication Data

US 2012/0126293 A1 May 24, 2012

Related U.S. Application Data

(63) Continuation-in-part of application No. PCT/JP2010/061148, filed on Jun. 30, 2010.

(30) Foreign Application Priority Data

Aug. 7, 2009 (JP) ................................ 2009-184066

(51) Int. Cl.
| | |
|---|---|
| H01L 29/20 | (2006.01) |
| H01L 21/02 | (2006.01) |
| C30B 29/40 | (2006.01) |
| C30B 25/18 | (2006.01) |
| H01L 29/872 | (2006.01) |
| H01L 29/778 | (2006.01) |

(52) U.S. Cl.
CPC ...... *H01L 21/0254* (2013.01); *H01L 21/02381* (2013.01); *H01L 21/02494* (2013.01); *H01L 21/02458* (2013.01); *C30B 29/403* (2013.01); *C30B 25/183* (2013.01); *H01L 21/02488* (2013.01); *H01L 29/2003* (2013.01); *H01L 29/872* (2013.01); *C30B 25/18* (2013.01); *H01L 21/02502* (2013.01); *H01L 21/0262* (2013.01); *H01L 29/7786* (2013.01)

USPC ........... 257/613; 257/615; 438/478; 438/482; 438/483

(58) Field of Classification Search
CPC ............ H01L 21/0254; H01L 29/2003; H01L 21/0262; H01L 21/205
USPC .............. 257/12, 76, 189, 613, 615; 438/478, 438/482, 483
See application file for complete search history.

(56) References Cited

U.S. PATENT DOCUMENTS

| | | | |
|---|---|---|---|
| 6,255,004 B1 | 7/2001 | Yoshida | |
| 6,890,791 B2 | 5/2005 | Ohtsuka et al. | |

(Continued)

FOREIGN PATENT DOCUMENTS

| | | | |
|---|---|---|---|
| JP | 10-163528 A | 6/1998 | |
| JP | 2004-349387 A | 12/2004 | |

(Continued)

OTHER PUBLICATIONS

Able, A., et al., "Growth of crack-free GaN on Si(111) with graded AlGaN buffer layers," J. Crystal Growth 2005;276:415-418.

(Continued)

*Primary Examiner* — Jack Chen
(74) *Attorney, Agent, or Firm* — Cermak Nakajima LLP; Tomoko Nakajima

(57) ABSTRACT

An epitaxial substrate, in which a group of group-III nitride layers is formed on a single-crystal silicon substrate so that a crystal plane is approximately parallel to a substrate surface, comprises: a first group-III nitride layer formed of AlN on the base substrate; a second group-III nitride layer formed of $In_{xx}Al_{yy}Ga_{zz}N$ ($xx+yy+zz=1$, $0 \leq xx \leq 1$, $0 < yy \leq 1$ and $0 < zz \leq 1$) on the first group-III nitride layer; and at least one third group-III nitride layer epitaxially-formed on the second group-III nitride layer, wherein: the first group-III nitride layer is a layer containing multiple defects including at least one type of a columnar crystal, a granular crystal, a columnar domain and a granular domain; and an interface between the first group-III nitride layer and the second group-III nitride layer is a three-dimensional asperity surface.

20 Claims, 8 Drawing Sheets

(56) References Cited

U.S. PATENT DOCUMENTS

2010/0327291 A1* 12/2010 Preble et al. ............... 257/76
2012/0126293 A1* 5/2012 Sumiya et al. .............. 257/201

FOREIGN PATENT DOCUMENTS

JP      2005-350321 A     12/2005
JP      2007-250721 A      9/2008

OTHER PUBLICATIONS

Kikkawa, T., "Highly Reliable 250 W GaN High Electron Mobility Transistor Power Amplifier," Jpn. J. Appl. Phys. 2005;44:4896-4901.

Lu, Y., et al., "Influence of the growth temperature of the high-temperature AlN buffer on the properties of GaN grown on Si (111) substrate," J. Crystal Growth 2004;263:4-11.

Chen, P., et al., "Growth of high quality GaN layers with AlN buffer on Si(111) substrates," H. Crystal Growth 2001;225:150-154.

International Search Report for PCT Patent App. No. PCT/JP2010/061148 (Aug. 3, 2010).

Zamir, S., et al., "The effect of AlN buffer layer on GaN grown on (111)-oriented Si substrates by MOCVD," J. Crystal Growth 2000;218:181-190.

International Preliminary Report on Patentability for PCT Patent App. No. PCT/JP2010/061148 (Feb. 7, 2012) with English translation thereof.

* cited by examiner

F I G . 2
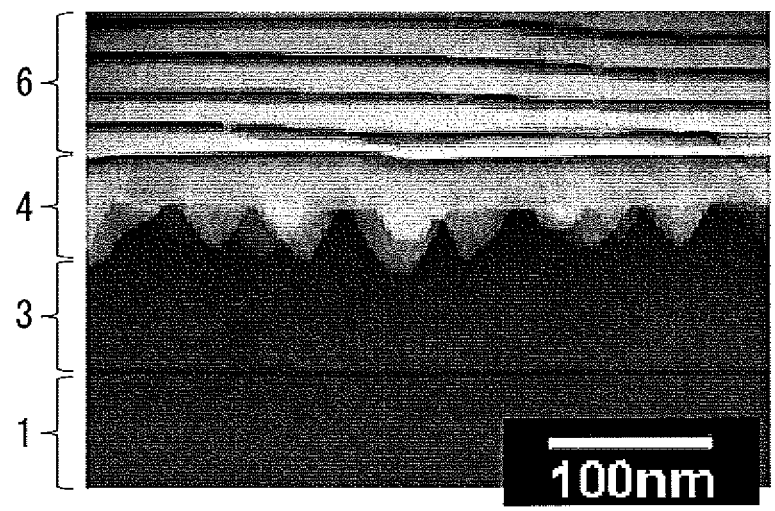

F I G . 3
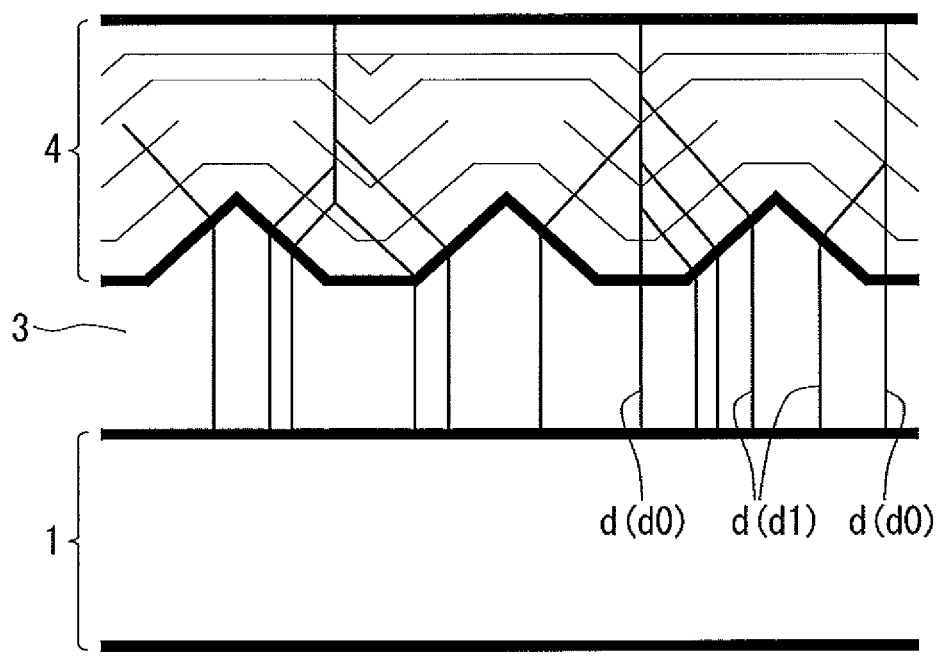

FIG. 4

| | MATERIAL NAME | DEPOSITION RATE OF INITIAL LAYER (nm/min) | AVERAGE THICKNESS OF INITIAL LAYER (nm) | FORMATION OF INTERFACE LAYER | EVALUATION RESULTS OF INITIAL LAYER | | | | | EVALUATION RESULTS OF FUNCTIONAL LAYER | | | | |
|---|---|---|---|---|---|---|---|---|---|---|---|---|---|---|
| | | | | | AVERAGE ROUGHNESS (nm) | AVERAGE INTERVAL OF CONVEXITIES (nm) | DENSITY OF CONVEXITY (NUMBER/cm2) | (0002) WIDTH AT HALF MAXIMUM (DEGREE) | (10-10) WIDTH AT HALF MAXIMUM (DEGREE) | APPEARANCE (PRESENCE /ABSENCE OF CRACK) | TOTAL DISLOCATION DENSITY (NUMBER/cm2) | SCREW DISLOCATION DENSITY (NUMBER/cm2) | (0002) WIDTH AT HALF MAXIMUM (SEC) | (10-10) WIDTH AT HALF MAXIMUM (SEC) |
| EXAMPLE1 | a-1 | 20 | 40 | — | 12 | 140 | 5.0E+09 | 1.0 | 1.1 | ABSENCE | 5.7E+09 | 1.8E+09 | 960 | 975 |
| | a-2 | 20 | 100 | — | 8 | 100 | 1.0E+10 | 0.8 | 0.8 | ABSENCE | 5.0E+09 | 1.6E+09 | 920 | 940 |
| | a-3 | 20 | 200 | — | 4 | 45 | 5.0E+10 | 0.9 | 1.1 | ABSENCE | 5.5E+09 | 1.8E+09 | 980 | 985 |
| | a-4 | 50 | 100 | — | 12 | 135 | 5.0E+09 | 1.1 | 1.0 | ABSENCE | 5.6E+09 | 1.7E+09 | 985 | 970 |
| COMPARATIVE EXAMPLE 1 | b-1 | 10 | 100 | — | 2.5 | — | — | 1.2 | 1.5 | ABSENCE | 6.0E+10 | 5.0E+09 | 1620 | 3310 |
| | b-2 | 20 | 30 | — | 16 | 182 | 3.0E+09 | 1.3 | 1.3 | PRESENCE | — | — | — | — |
| | b-3 | 20 | 300 | — | 3.5 | — | — | 1.1 | 1.3 | ABSENCE | 2.5E+10 | 4.0E+09 | 1420 | 1990 |
| | b-4 | 10 | 500 | — | 0.5 | — | — | 0.05 | 0.6 | PRESENCE | — | — | — | — |
| EXAMPLE2 | a-5 | 20 | 40 | SiAlON | 12 | 140 | 5.0E+09 | 0.6 | 1.1 | ABSENCE | 2.9E+09 | 9.0E+08 | 740 | 980 |
| | a-6 | 20 | 100 | SiAlON | 8 | 100 | 1.0E+10 | 0.5 | 0.8 | ABSENCE | 2.8E+09 | 8.00E+08 | 720 | 940 |
| | a-7 | 20 | 200 | SiAlON | 4 | 45 | 5.0E+10 | 0.6 | 1.1 | ABSENCE | 2.9E+09 | 9.0E+08 | 735 | 980 |
| | a-8 | 50 | 100 | SiAlON | 12 | 135 | 5.0E+09 | 0.8 | 1.0 | ABSENCE | 3.0E+09 | 9.5E+08 | 745 | 975 |

FIG. 5

| | MATERIAL NAME | FILM THICKNESS OF INTERLAYER (nm) | FORMATION OF INTERFACE LAYER | EVALUATION RESULTS OF FUNCTIONAL LAYER ||||| |
|---|---|---|---|---|---|---|---|---|
| | | | | APPEARANCE (PRESENCE /ABSENCE OF CRACK) | TOTAL DISLOCATION DENSITY (NUMBER/cm²) | SCREW DISLOCATION DENSITY (NUMBER/cm²) | (0002) WIDTH AT HALF MAXIMUM (SEC) | (10-10) WIDTH AT HALF MAXIMUM (SEC) | |
| EXAMPLE3 | a-9 | 40 | — | ABSENCE | 5.0E+09 | 1.6E+09 | 920 | 940 | =a-2 OF EXAMPLE 1 |
| | a-10 | 50 | — | ABSENCE | 5.0E+09 | 1.6E+09 | 920 | 940 | |
| | a-11 | 80 | — | ABSENCE | 5.0E+09 | 1.8E+08 | 920 | 945 | |
| | a-12 | 100 | — | ABSENCE | 5.0E+09 | 1.9E+08 | 925 | 940 | |
| | a-13 | 500 | — | ABSENCE | 5.0E+09 | 1.9E+08 | 925 | 940 | |
| COMPARATIVE EXAMPLE2 | b-5 | 20 | — | ABSENCE | 1.1E+10 | 2.9E+09 | 1210 | 1200 | |
| | b-6 | 30 | — | ABSENCE | 1.2E+10 | 2.8E+09 | 1180 | 1300 | |
| | b-7 | 35 | — | ABSENCE | 1.1E+10 | 2.9E+09 | 1200 | 1250 | |
| EXAMPLE4 | a-14 | 40 | SiAlON | ABSENCE | 2.8E+09 | 8.0E+09 | 715 | 940 | =a-6 OF EXAMPLE 2 |
| | a-15 | 50 | SiAlON | ABSENCE | 2.8E+09 | 8.0E+09 | 720 | 940 | |
| | a-16 | 80 | SiAlON | ABSENCE | 2.8E+09 | 8.0E+09 | 720 | 940 | |
| | a-17 | 100 | SiAlON | ABSENCE | 2.8E+09 | 8.0E+09 | 720 | 945 | |
| | a-18 | 500 | SiAlON | ABSENCE | 2.8E+09 | 8.0E+09 | 720 | 940 | |

FIG. 6

| | MATERIAL NAME | COMPOSITION OF INTERLAYER | FORMATION OF INTERFACE LAYER | EVALUATION RESULTS OF FUNCTIONAL LAYER ||||
|---|---|---|---|---|---|---|---|
| | | | | APPEARANCE (PRESENCE /ABSENCE OF CRACK) | TOTAL DISLOCATION DENSITY (NUMBER/cm$^2$) | SCREW DISLOCATION DENSITY (NUMBER/cm$^2$) | (0002) WIDTH AT HALF MAXIMUM (SEC) | (10-10) WIDTH AT HALF MAXIMUM (SEC) |
| EXAMPLE5 | a-19 | Al$_{0.1}$Ga$_{0.9}$N | — | ABSENCE | 5.3E+09 | 1.8E+09 | 930 | 945 | =a-2 OF EXAMPLE 1 |
| | a-20 | Al$_{0.3}$Ga$_{0.7}$N | — | ABSENCE | 5.0E+09 | 1.6E+09 | 920 | 940 |
| | a-21 | Al$_{0.4}$Ga$_{0.6}$N | — | ABSENCE | 5.5E+09 | 1.8E+08 | 935 | 945 |
| | a-22 | Al$_{0.7}$Ga$_{0.4}$N | — | ABSENCE | 5.7E+09 | 1.9E+08 | 945 | 965 |
| EXAMPLE6 | a-23 | Al$_{0.1}$Ga$_{0.9}$N | SiAlON | ABSENCE | 2.9E+09 | 8.5E+08 | 730 | 955 | =a-6 OF EXAMPLE 2 |
| | a-24 | Al$_{0.3}$Ga$_{0.7}$N | SiAlON | ABSENCE | 2.8E+09 | 8.0E+08 | 720 | 940 |
| | a-25 | Al$_{0.4}$Ga$_{0.6}$N | SiAlON | ABSENCE | 2.9E+08 | 8.5E+08 | 710 | 965 |
| | a-26 | Al$_{0.7}$Ga$_{0.4}$N | SiAlON | ABSENCE | 3.0E+09 | 9.0E+08 | 760 | 975 |

F I G . 7

| | FORMATION OF INTERFACE LAYER | FORMATION OF SUPERLATTICE STRUCTURE LAYER | FUNCTIONAL LAYER TOTAL DISLOCATION DENSITY (NUMBER/cm$^2$) | SCHOTTKY DIODE CHARACTERISTICS | |
|---|---|---|---|---|---|
| | | | | LEAKAGE CURRENT IN APPLICATION OF 100-V VOLTAGE (A/cm$^2$) | BREAKDOWN VOLTAGE (V) |
| EXAMPLE7 | — | — | 5.0E+09 | 1.0E-06 | 180 |
| EXAMPLE8 | SiAlON | — | 2.8E+09 | 5.0E-07 | 180 |
| EXAMPLE9 | — | AlN/GaN FOR 40 PERIODS | 5.0E+09 | 1.0E-06 | 550 |
| EXAMPLE10 | SiAlON | AlN/GaN FOR 40 PERIODS | 3.0E+09 | 5.0E-07 | 550 |
| COMPARATIVE EXAMPLE4 | USE OF SUBSTRATE CORRESPONDING TO COMPARATIVE EXAMPLE 3 (SAPPHIRE BASE) | | 2.5E+09 | 1.0E-06 | 180 |

FIG. 8

| | FORMATION OF INTERFACE LAYER | FORMATION OF SUPERLATTICE STRUCTURE LAYER | AlGaN/GaN LAMINATED STRUCTURE CHARACTERISTICS | |
|---|---|---|---|---|
| | | | ELECTRON MOBILITY ($cm^2/Vs$) | TWO-DIMENSIONAL ELECTRON DENSITY ($/cm^2$) |
| EXAMPLE11 | — | — | 1400 | $1.0E+13$ |
| EXAMPLE12 | SiAlON | — | 1500 | $1.0E+13$ |
| EXAMPLE13 | — | AlN/GaN FOR 40 PERIODS | 1400 | $1.0E+13$ |
| EXAMPLE14 | SiAlON | AlN/GaN FOR 40 PERIODS | 1500 | $1.0E+13$ |
| COMPARATIVE EXAMPLE5 | USE OF SUBSTRATE CORRESPONDING TO COMPARATIVE EXAMPLE 3 (SAPPHIRE BASE) | | 1500 | $1.0E+13$ |

EPITAXIAL SUBSTRATE FOR SEMICONDUCTOR DEVICE, METHOD FOR MANUFACTURING EPITAXIAL SUBSTRATE FOR SEMICONDUCTOR DEVICE, AND SEMICONDUCTOR DEVICE

This application is a Continuation-in-Part under 35 U.S.C. §120 to PCT Patent Application No. PCT/JP2010/061148, filed Jun. 30, 2010, which claims priority under 35 U.S.C. §119 to Japanese Patent Application No. 2009-184066, filed Aug. 7, 2009, the entireties of which are incorporated by reference herein.

TECHNICAL FIELD

The present invention relates to an epitaxial substrate for semiconductor devices, and more particularly, to an epitaxial substrate including a group-III nitride.

BACKGROUND ART

Nitride semiconductors having wide direct transition band gap, high breakdown electric field and high saturation electron velocity have been attracting attention as semiconductor materials for light-emitting devices such as LED and LD and high frequency/high power electronic devices such as HEMT (for example, see "Highly Reliable 250 W GaN High Electron Mobility Transistor Power Amplifier", Toshihide Kikkawa, Jpn. J. Appl. Phys. 44 (2005), p. 4896 (Non-Patent Document 1)).

In order to reduce a cost of an epitaxial substrate and further to achieve a higher degree of integration with a silicon circuit device, research and development are conducted on the use of single-crystal silicon as a base substrate in manufacturing the above-mentioned nitride device (for example, see Japanese Patent Application Laid-Open No. 10-163528 (1998) (Patent Document 1), Japanese Patent Application Laid-Open No. 2004-349387 (Patent Document 2), and Japanese Patent Application Laid-Open No. 2005-350321 (Patent Document 3)).

Unfortunately, it is known that the formation of a good quality nitride film on a silicon substrate is much more difficult compared with the case of using a sapphire substrate or SiC substrate, from the following reasons.

First, silicon and nitride material are considerably different in the value of the lattice constant. This causes the generation of misfit dislocations at an interface between a silicon substrate and a deposited film or acceleration of a three-dimensional growth mode at the timing from nucleation to growth. In other words, this inhibits the formation of a good nitride epitaxial film that has a low dislocation density and has a flat surface.

Further, the nitride material has a larger thermal expansion coefficient value compared with silicon, and thus a tensile stress acts on the inside of a nitride film in the process of decreasing the temperature to about a room temperature after epitaxially-growing the nitride film on a silicon substrate at a high temperature. As a result, a crack is prone to occur on the film surface and a substrate tends to warp considerably.

In addition, it is known that trimethylgallium (TMG) being a source gas of a nitride material in vapor deposition is prone to form a liquid compound with silicon, which inhibits epitaxial growth.

From the reasons above, in the deposition of a nitride material on a silicon substrate, it is a significant technical challenge to, for example, inhibit dislocations or cracks in the film and further reduce warping of a wafer due to a stress, while maintaining the flatness of a film surface.

It is certainly possible to epitaxially-grow a GaN film on a silicon substrate in the cases of using the conventional technologies disclosed in Japanese Patent Application Laid-Open No. 10-163528 (1998), Japanese Patent Application Laid-Open No. 2004-349387, Japanese Patent Application Laid-Open No. 2005-350321 and Kikkawa. However, the GaN film obtained does not always have crystal quality that is as good as in the case of using SiC or sapphire as a base substrate. Thus, in the case of manufacturing, for example, an electronic device such as HEMT by the conventional technology, there arose problems of low electron mobility and low leakage current and low breakdown voltage.

SUMMARY OF INVENTION

The present invention has been made in view of the above-mentioned problems, and an object thereof is to provide a nitride epitaxial substrate that includes single-crystal silicon as a base substrate and has excellent quality and characteristics.

In order to solve the above-mentioned problems, according to a first aspect of the present invention, an epitaxial substrate for semiconductor device, in which a group of group-III nitride layers are formed on a base substrate including single-crystal silicon having a (111) orientation so that a (0001) crystal plane is approximately parallel to a surface of the base substrate, comprises: a first group-III nitride layer formed of AlN on the base substrate; a second group-III nitride layer formed of $In_{xx}Al_{yy}Ga_{zz}N$ (xx+yy+zz=1, 0≤xx<1, 0≤yy<1, and 0<zz≤1) on the first group-III nitride layer; and at least one third group-III nitride layer epitaxially-formed on the second group-III nitride layer, wherein: the first group-III nitride layer is a layer containing multiple defects including at least one type of a columnar crystal, a granular crystal, a columnar crystal and a granular domain; and an interface between the first group-III nitride layer and the second group-III nitride layer is a three-dimensional asperity surface.

According to a second aspect of the present invention, in the epitaxial substrate of the first aspect, an X-ray rocking curve full width at half maximum of a (0002) plane of the first group-III nitride layer is 0.8 degrees or more and 1.1 degrees or less and an X-ray rocking curve full width at half maximum of a (10-10) plane thereof is 0.8 degrees or more and 1.1 degrees or less.

According to a third aspect of the present invention, in the epitaxial substrate of the first or second aspect, an amorphous interface layer is formed between the base substrate and the first group-III nitride layer.

According to a fourth aspect of the present invention, in the epitaxial substrate of the third aspect, the interface layer is formed of $SiAl_xO_yN_z$.

According to a fifth aspect of the present invention, in the epitaxial substrate of the third or fourth aspect, the X-ray rocking curve full width at half maximum of the (0002) plane of the first group-III nitride layer is 0.5 degrees or more and 0.8 degrees or less.

According to aسsixth aspect of the present invention, in the epitaxial substrate of any one of the first to fifth aspects, when an average roughness of a 5 μm×5 μm area of a surface to be measured with an atomic force microscope is defined as a surface roughness, an interface between the second group-III nitride layer and the at least one third group-III nitride layer has a surface roughness of 4 nm or more and 12 nm or less.

According to a seventh aspect of the present invention, in the epitaxial substrate of any one of the first to sixth aspects, the second group-III nitride layer is formed of $Al_{yy}Ga_{zz}N$ ($yy+zz=1$, $0 \leq yy<1$, and $0<zz \leq 1$).

According to an eighth aspect of the present invention, in the epitaxial substrate of any one of the first to seventh aspects, convexities of the first group-III nitride layer has a density of $5 \times 10^9/cm^2$ or more and $5 \times 10^{10}/cm^2$ or less.

According to a ninth aspect of the present invention, in the epitaxial substrate of any one of the first to eighth aspects, the convexities of the first group-III nitride layer have an average interval of 45 nm or more and 140 nm or less.

According to a tenth aspect of the present invention, in the epitaxial substrate of any one of the first to ninth aspects, the at least one third group-III nitride layer includes a functional layer of a semiconductor device.

According to an eleventh aspect of the present invention, in the epitaxial substrate of any one of the first to tenth aspects, the at least one third group-III nitride layer includes a superlattice structure layer obtained by periodically laminating two or more types of group-III nitride layers having different compositions directly on the second group-III nitride layer.

According to a twelfth aspect of the present invention, a semiconductor device is manufactured using the epitaxial substrate of any one of the first to eleventh aspects.

According to a thirteenth aspect of the present invention, a method of manufacturing epitaxial substrate for semiconductor device, in which a group of group-III nitride layers is formed on a base substrate of single-crystal silicon having a (111) orientation so that a (0001) crystal plane is approximately parallel to a surface of the base substrate, comprises: a first formation step of forming a first group-III nitride layer of AlN on the base substrate; a second formation step of forming, on the first group-III nitride layer, a second group-III nitride layer of $In_{xx}Al_{yy}Ga_{zz}N$ ($xx+yy+zz=1$, $0 \leq xx<1$, $0 \leq yy<1$, and $0<zz \leq 1$); and a third formation step of epitaxially-forming at least one third group-III nitride layer on the second group-III nitride layer, wherein in the first formation step, the first group-III nitride layer is formed as a layer containing multiple defects that includes at least one type of a columnar crystal, a granular crystal, a columnar domain and a granular domain and has a surface being a three-dimensional asperity surface.

According to a fourteenth aspect of the present invention, in the method of manufacturing epitaxial substrate of the thirteenth aspect, in the first formation step, the first group-III nitride layer is formed at a deposition rate of 20 nm/min. or more so as to have an average film thickness of 200 nm or less.

According to a fifteenth aspect of the present invention, the method of manufacturing epitaxial substrate of the thirteenth or fourteenth aspect further includes an interface layer formation step of forming an amorphous interface layer between the base substrate and the first group-III nitride layer.

According to a sixteenth aspect of the present invention, in the method of manufacturing epitaxial substrate of the fifteenth aspect, the interface layer is formed of $SiAl_xO_yN_z$.

According to a seventeenth aspect of the present invention, in the method of manufacturing epitaxial substrate of any one of the thirteenth to sixteenth aspects, in the second formation step, when an average roughness of a 5 μm×5 μm area of a surface to be measured with an atomic force microscope is defined as a surface roughness, the second group-III nitride layer having a surface roughness of 4 nm or more and 12 nm or less is formed.

According to an eighteenth aspect of the present invention, in the method of manufacturing epitaxial substrate of any one of the thirteenth to seventeenth aspects, in the second formation step, the second group-III nitride layer is formed of $Al_{xx}Ga_{zz}N$ ($yy+zz=1$, $0 \leq xx<1$, and $0<zz \leq 1$).

According to a nineteenth aspect of the present invention, in the method of manufacturing epitaxial substrate of any one of the thirteenth to eighteenth aspects, the third formation step includes the step of forming a functional layer of a semiconductor device.

According to a twenties aspect of the present invention, in the method of manufacturing epitaxial substrate of any one of the thirteenth to nineteenth aspects, the third formation step includes the step of periodically laminating two or more types of group-III nitride layers having different compositions directly on the second group-III nitride layer.

According to a twenty-first aspect of the present invention, an epitaxial substrate for semiconductor device is manufactured by the method of manufacturing epitaxial substrate of any one of the thirteenth to twenties aspects.

According to a twenty-second aspect of the present invention, a semiconductor device includes the epitaxial substrate for semiconductor device that is manufactured by the method of manufacturing epitaxial substrate of any one of the thirteenth to twenties aspects.

According to the first to twenty-second aspects of the present invention, a lattice misfit between a base substrate and a second group-III nitride layer is relieved by providing a first group-III nitride layer as a layer containing multiple defects having poor crystallinity. Further, an interface between the first group-III nitride layer and the second group-III nitride layer is formed to have a three-dimensional asperity surface, whereby the dislocations that have occurred in the first group-III nitride layer are bent at the interface to be united and disappear in the second group-III nitride layer. As a result, even in the case of using a single-crystal silicon substrate as a base substrate, it is possible to achieve an epitaxial substrate comprising a group-III nitride functional layer having nearly equal quality and characteristics to those in the case of including a sapphire substrate or SiC substrate. The use of such an epitaxial substrate enables to provide a semiconductor device such as HEMT at a lower cost compared with the case of using a sapphire substrate or SiC substrate.

BRIEF DESCRIPTION OF DRAWINGS

FIG. 2 is a figure showing a high-angle annular dark-field (HAADF) image of the epitaxial substrate 10.

FIG. 3 is a view schematically showing a state in which dislocations disappear in the epitaxial substrate 10.

FIG. 4 is a figure showing AlN layer formation conditions and various evaluation results of epitaxial substrates according to Example 1, Example 2 and Comparative Example 1.

FIG. 5 is a figure showing a formed film thickness of an interlayer and evaluation results of a functional layer of epitaxial substrates according to Example 3, Example 4 and Comparative Example 2.

FIG. 6 is a figure showing a composition of an interlayer and evaluation results of a functional layer of epitaxial substrates according to Example 5 and Example 6.

FIG. 7 is a figure showing a layer configuration and various evaluation results of epitaxial substrates according to Example 7 to Example 10 and Comparative Example 4.

FIG. 8 is a figure showing a layer configuration and various evaluation results of epitaxial substrates according to Example 11 to Example 14 and Comparative Example 5.

BEST MODE FOR CARRYING OUT THE INVENTION

<Schematic Configuration of Epitaxial Substrate>

Figure 1:
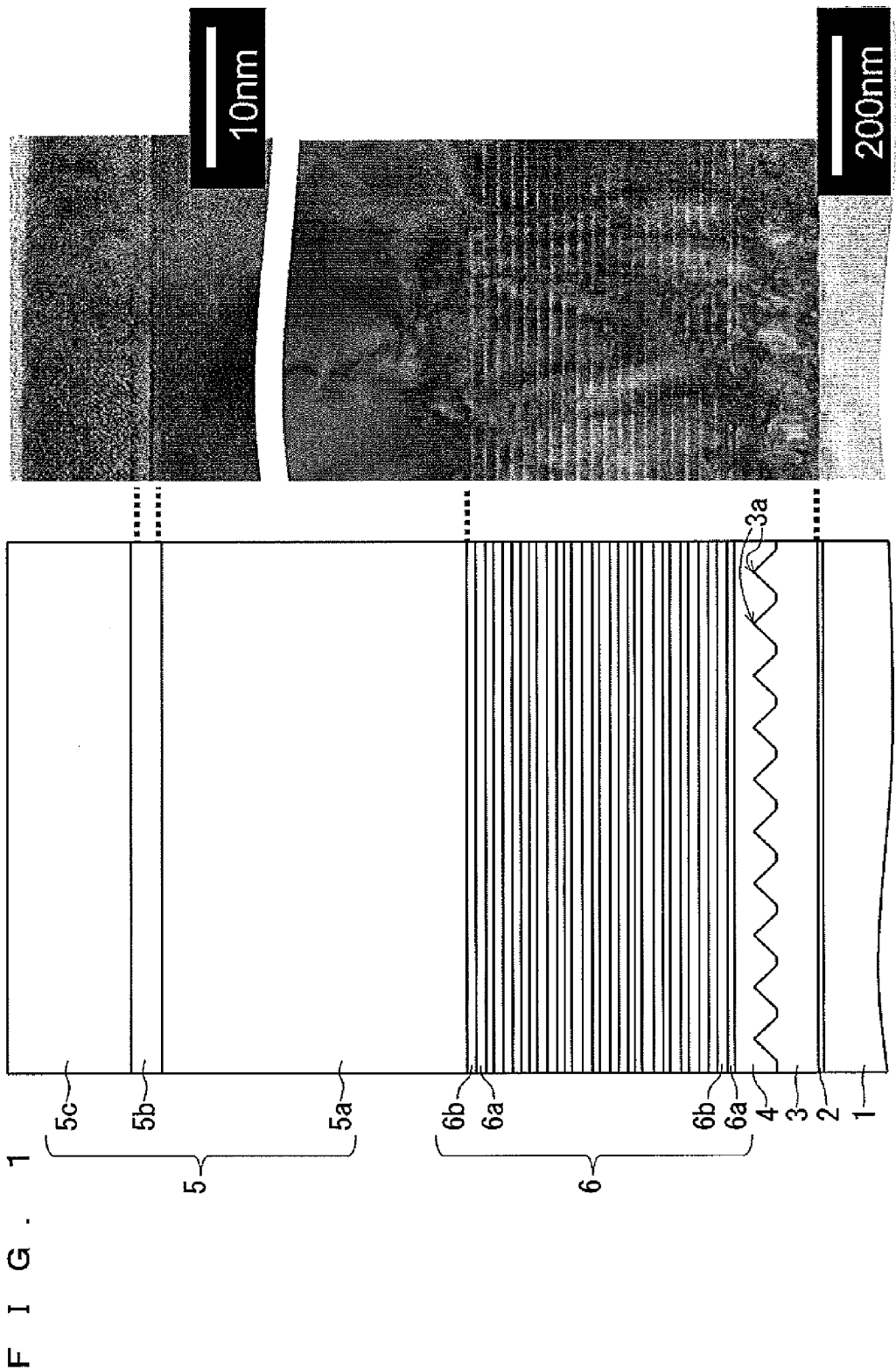
FIG. 1 is a figure showing a schematic cross-section that schematically shows a configuration of an epitaxial substrate 10 according to an embodiment of the present invention and a TEM-observed image of the epitaxial substrate 10 in a comparative manner.

FIG. 1 is a figure showing a schematic cross-section that schematically shows a configuration of an epitaxial substrate 10 according to an embodiment of the present invention and an observed image of the epitaxial substrate 10 with a transmission electron microscope (TEM) in a comparative manner.

The epitaxial substrate 10 mainly includes a base substrate 1, an initial layer 3, an interlayer 4 and a functional layer 5. Further, as shown in FIG. 1, the epitaxial substrate 10 may include an interface layer 2 between the base substrate 1 and the initial layer 3 or a superlattice structure layer 6 between the interlayer 4 and the functional layer 5. The interface layer 2 and the superlattice structure layer 6 are described below.

The base substrate 1 is a (111) plane single-crystal silicon wafer. The thickness of the base substrate 1 is not particularly limited, but in terms of handling, the base substrate 1 having a thickness of several hundreds µm to several mm is preferably used.

The initial layer 3, the interlayer 4, the functional layer 5 and the superlattice structure layer 6 are layers respectively obtained by forming a Wurtzite group-III nitride by the epitaxial growth method such that its (0001) crystal plane is approximately parallel to the substrate surface of the base substrate 1. The metal organic chemical vapor deposition method (MOCVD method) is a preferable example for the formation of those layers.

The initial layer 3 is a layer composed of AlN (first group-III nitride layer). As is apparent from the TEM image of FIG. 1, the initial layer 3 is a layer composed of a number of minute columnar crystals or the like (at least one type of columnar crystals, granular crystals, columnar domains and granular domains) deposited in the direction (deposition direction) approximately perpendicular to the substrate surface of the base substrate 1. In other words, the initial layer 3 is a layer containing multiple defects, which contains a large number of grain boundaries or dislocations along a laminated direction and has poor crystallinity though it is uniaxially oriented in the laminated direction of the epitaxial substrate 10. Note that in the present embodiment, at times, a domain boundary and a dislocation are also referred to as a grain boundary for the sake of convenience. The interval between grain boundaries in the initial layer 3 is approximately several tens nm at most.

The initial layer 3 having the above-mentioned configuration is formed such that an X-ray rocking curve full width at half maximum of a (0002) plane, which serves as an indicator of the magnitude of mosaicity in a c-axis inclination component or an amount of screw dislocations, is 0.5 degrees or more and 1.1 degrees or less and that an X-ray rocking curve full width at half maximum of a (10-10) plane, which serves as an indicator of the magnitude of mosaicity in a rotational component of a crystal where the c-axis or an amount of edge dislocations is a rotation axis, is 0.8 degrees or more and 1.1 degrees or less.

Meanwhile, the interlayer 4 is a layer composed of a group-III nitride (second group-III nitride layer) having the composition of $In_{xx}Al_{yy}Ga_{zz}N$ (xx+yy+zz=1, 0≤xx<1, 0≤yy<1, 0<zz≤1), which is formed on the initial layer 3. Preferably, the interlayer 4 is composed of a group-III nitride having the composition of $Al_{yy}Ga_{zz}N$ (yy+zz=1, 0≤yy<1, 0<zz≤1).

The functional layer 5 is at least one layer composed of a group-III nitride, which is a layer exhibiting a predetermined function in the case where a semiconductor device is configured by further forming a predetermined semiconductor layer, electrode and the like on the epitaxial substrate 10. Accordingly, the functional layer 5 is formed of one or a plurality of layers having the composition and thickness corresponding to the function.

<Detailed Configurations and Effects of Initial Layer and Interlayer>

An interface I1 between the initial layer 3 and the interlayer 4 (surface of the initial layer 3) is a three-dimensional asperity surface that reflects the outer shape of columnar crystals or the like forming the initial layer 3. The shape of the interface I1 as described above is clearly observed from a high-angle annular dark-field (HAADF) image of the epitaxial substrate 10 illustrated in FIG. 2. Note that the HAADF image is a mapping image of integrated intensity of electrons inelastically-scattered at a high angle, which is obtained with a scanning transmission electron microscope (STEM). In the HAADF image, the image intensity is proportional to the square of the atomic number, and a spot where an atom has a larger atomic number is observed brighter (whiter).

In the epitaxial substrate 10, the initial layer 3 is composed of AlN, while the interlayer 4 is a layer that contains at least Ga, has the composition different from that of AlN, and may further contain In, as expressed by the composition formula above. Ga and In have larger atomic numbers than that of Al, and thus it is observed in FIG. 2 that the interlayer 4 is relatively bright and the initial layer 3 is relatively dark. Accordingly, it is easily recognized from FIG. 2 that the interface I1 therebetween has become a three-dimensional asperity surface.

It is shown that convexities 3a of the initial layer 3 are positioned at approximately equal intervals in the schematic cross-section of FIG. 1 merely for the sake of convenience and, in actuality, the convexities 3a are not necessarily positioned at equal intervals. Preferably, the initial layer 3 is formed such that the density of the convexity 3a is $5\times10^9/cm^2$ or more and $5\times10^{10}/cm^2$ or less and the average interval of the convexities 3a is 45 nm or more and 140 nm or less. In the case where those ranges are satisfied, it is possible to form the functional layer 5 that is particularly excellent in crystal quality. In the present embodiment, the convexity 3a of the initial layer 3 denotes the position of an almost vertex at the convex location on the surface (interface I1). As a result of the experiment and observation by the inventors of the present invention, it has been confirmed that the side wall of the convexity 3a is a (10-11) plane or (10-12) plane of AlN.

It is preferable to form the initial layer 3 such that an average film thickness is 40 nm or more and 200 nm or less, for the formation of the convexities 3a that satisfy the above-mentioned density and average intervals on the surface of the initial layer 3. In the case of the average film thickness of smaller than 40 nm, it is difficult to achieve the state in which the substrate surface is entirely covered with AlN while forming the above-mentioned convexities 3a. On the other hand, in the case of the average film thickness of larger than 200 nm, it is difficult to form the above-mentioned convexities 3a because the AlN surface starts becoming flat.

The initial layer 3 is formed under predetermined epitaxial growth conditions, and the formation of the initial layer 3 of AlN is preferred in that Ga which forms a liquid compound with silicon is not contained and that the interface I1 is likely to be formed as a three-dimensional asperity surface owing to relatively slow lateral growth.

In the epitaxial substrate 10, the initial layer 3 being a multiple defects containing layer that contains inwardly grain boundaries in the above-mentioned manner is interposed between the base substrate 1 and the interlayer 4, whereby a lattice misfit between the base substrate 1 and the interlayer 4 or the functional layer 5 further provided thereon is relieved, which suppresses the accumulation of the strain energy due to the lattice misfit. The ranges of the X-ray rocking curve full width at half maximums of the (0002) plane and the (10-10) plane of the initial layer 3 described above are determined as the ranges in which the accumulation of the strain energy due to the grain boundaries is preferably suppressed.

Due to the initial layer 3 being interposed, however, a large number of dislocations starting from the grain boundaries of the columnar crystals or the like of the initial layer 3 propagate through the interlayer 4. In the present embodiment, such dislocations are reduced effectively by forming the interface I1 between the initial layer 3 and the interlayer 4 as the three-dimensional asperity surface as described above. FIG. 3 is a figure schematically showing the state in which the dislocations disappear in the epitaxial substrate 10. Note that the interface layer 2 described below is omitted in FIG. 3.

The formation of the interface I1 between the initial layer 3 and the interlayer 4 as a three-dimensional asperity surface causes most of dislocations d generated in the initial layer 3 to be bent at the interface I1 when propagating (passing) from the initial layer 3 to the interlayer 4, as shown in FIG. 3. More specifically, the dislocations d (d0) propagating through the parts of the interface I1 that are appropriately parallel to the base substrate 1 may reach the upper portion of the interlayer 4, whereas the dislocations d (d1) propagating through the parts of the interface I1 that are inclined with respect to the base substrate 1 are united and disappear inside the interlayer 4. As a result, the dislocations that pass through the interlayer 4 are just a part of the dislocations starting from the initial layer 3.

Further, as the state being schematically shown in FIG. 3, preferably, the interlayer 4 is formed along the surface shape of the initial layer 3 in the very initial growth, and the surface thereof is gradually flattened as growth advances, which is formed so as to have surface roughness of 10 nm or less in the end. In the present embodiment, the surface roughness is represented by an average roughness ra of a 5 μm×5 μm area that is measured with an atomic force microscope (AFM). Incidentally, it is preferable that the interlayer 4 be formed of a group-III nitride containing at least Ga that is relatively likely to grow in a lateral direction in that the interlayer 4 has good surface flatness.

Further, it is preferable that the interlayer 4 have an average thickness of 40 nm or more. This is because a problem that asperities resulting from the initial layer 3 are not flattened sufficiently and a problem that the dislocations having propagated through the interlayer 4 do not disappear sufficiently by being united with each other occur in the case of the formation of less than 40 nm. Note that in the case of the formation to obtain an average thickness of 40 nm or more, the dislocation density is reduced effectively and the surface is flattened effectively. Therefore, technically, an upper limitation is not particularly imposed on the thickness of the interlayer 4, but the interlayer 4 is preferably formed to have a thickness of approximately several μm or less from the viewpoint of productivity.

The formation in the above-mentioned manner allows the interlayer 4 to preferably reduce the dislocation density and have excellent crystal quality at least in the vicinity of the surface (that is, in the vicinity of the interface with the functional layer 5 or the superlattice structure layer 6). This enables to obtain excellent crystal quality also in the functional layer 5. Alternatively, it is possible to form the functional layer 5 to have a smaller number of dislocations compared with the interlayer 4 depending on the compositions and formation conditions of the interlayer 4 and the functional layer 5. For example, it is possible to form the functional layer 5 having excellent crystal quality that has a dislocation density of $6\times10^9/cm^2$ or less (in which the density of screw dislocation is $2\times10^9/cm^2$ or less) and has X-ray rocking cure full width at half maximums of the (0002) plane and (10-10) plane of 1,000 sec or less. That is, the functional layer 5 is formed as the layer having a small number of dislocations and highly excellent crystallinity and having a much smaller degree of mosaicity compared with the initial layer 3.

The value of the dislocation density in the case where a group of group-III nitride layers having the same total film thickness is formed on a sapphire substrate or SiC substrate through a low-temperature GaN buffer layer or the like by the MOCVD method falls within the range of approximately $5\times10^8$ to $1\times10^{10}/cm^2$. Accordingly, the above-mentioned results show that the epitaxial substrate having identical quality to that in the case of using a sapphire substrate is achieved by using a single-crystal silicon wafer cheaper than the sapphire substrate as the base substrate 1.

<Interface Layer>

As described above, the epitaxial substrate 10 may include the interface layer 2 between the base substrate 1 and the initial layer 3. As a preferable example, the interface layer 2 has a thickness of approximately several nm and is composed of amorphous $SiAl_xO_yN_z$.

In the case where the interface layer 2 is provided between the base substrate 1 and the initial layer 3, a lattice misfit between the base substrate 1 and the interlayer 4 or the like is relieved more effectively, which further improves the crystal quality of the interlayer 4 and the functional layer 5. That is, in the case of including the interface layer 2, the AlN layer being the initial layer 3 is formed so as to have similar asperity shape to that in the case where the interface layer 2 is not included and has smaller grain boundaries contained compared with the case where the interface layer 2 is not included. The initial layer 3 having an improved value of the X-ray rocking curve full width at half maximum particularly in the (0002) plane is obtained. This is because nucleation of AlN that turns into the initial layer 3 is more unlikely to advance in the case of forming the initial layer 3 on the interface layer 2 compared with the case of forming the initial layer 3 directly on the base substrate 1, and accordingly, lateral growth is advanced more compared with the case where the interface layer 2 is not provided. Note that the interface layer 2 is formed to such an extent that the film thickness thereof does not exceed 5 nm. In the case where the interface layer 2 as described above is provided, the initial layer 3 can be formed such that the X-ray rocking curve full width at half maximum of the (0002) plane falls within the range of 0.5 degrees or more and 0.8 degrees or less. In this case, it is possible to form the functional layer 5 having more excellent crystal quality in which the X-ray rocking curve full width at half maximum of the (0002) plane is 800 sec or less and the screw dislocation density is $1\times10^9/cm^2$ or less.

Note that at least one of an Si atom and an O atom may be diffused in the initial layer 3 to make a solid solution or at least one of an N atom and an O atom may be diffused in the base substrate 1 to make a solid solution, in the formation of the initial layer 3.

<Superlattice Structure Layer>

As described above, the epitaxial substrate 10 may include the superlattice structure layer 6 between the interlayer 4 and the functional layer 5. In the example shown in FIG. 1, the superlattice structure layer 6 is formed by repeatedly laminating a first unit layer 6a and a second unit layer 6b that are two types of group-III nitride layers having different compositions on the interlayer 4 in an alternate manner. Here, a pair of one first unit layer 6a and one second unit layer 6b is also referred to as a pair layer.

In the epitaxial substrate 10, strains are caused in an in-plane direction of the interlayer 4 due to a large difference in the value of thermal expansion coefficient between a single-crystal silicon wafer being the base substrate 1 and the group-III nitride, and the superlattice structure layer 6 has an action of relieving those strains to suppress the propagation of the strains to the functional layer 5.

The superlattice structure layer 6 is not a component essential to the epitaxial substrate 10, but the provision of the superlattice structure layer 6 increases the total film thickness of the group of group-III nitride layers in the epitaxial substrate 10, leading to an effect that the breakdown voltage is improved in the semiconductor device. Even when the superlattice structure layer 6 is interposed between the interlayer 4 and the functional layer 5, the crystal quality of the functional layer 5 is maintained to a sufficient degree (as sufficiently as in the case where the superlattice structure layer 6 is not provided) as long as the formation conditions are set preferably.

In the case of the epitaxial substrate 10 for a HEMT device shown in FIG. 1, as a preferable example, the superlattice structure layer 6 is formed such that the first unit layer 6a is formed of GaN to have a thickness of approximately several tens nm and the second unit layer 6b is formed of AlN to have a thickness of approximately several nm. FIG. 1 illustrates the case where the pair layer is repeatedly formed 15 times.

The functional layer 5 is formed after repeatedly forming the pair layer to such an extent that strains inherent in the interlayer 4 are relieved sufficiently, to thereby achieve the epitaxial substrate 10 in which cracks or warping due to a difference in the thermal expansion coefficient between the base substrate 1 and the group of group-III nitride layers is preferably suppressed. In other words, the superlattice structure layer 6 has a function of relieving the propagation of strains toward the functional layer 5 in the epitaxial substrate 10.

<Specific Mode of Functional Layer>

FIG. 1 illustrates the case where, assuming that the epitaxial substrate 10 is used as a substrate for a HEMT device, a channel layer 5a made of high-resistance GaN, a spacer layer 5b made of AlN and a barrier layer 5c made of AlGaN, InAlN or the like are formed as the functional layer 5. It is preferable to form the channel layer 5a to have a thickness of several μm. It is preferable to form the spacer layer 5b to have a thickness of approximately 1 nm. Note that the spacer layer 5b is not an essential component for forming a HEMT device. It is preferable to form the barrier layer 5c to have a thickness of approximately several tens nm. With the above-mentioned configuration, a two-dimensional electron gas region is formed owing to a spontaneous polarization effect or a piezoelectric polarization effect in the vicinity of the heterojunction interface between the channel layer 5a and the barrier layer 5c (or spacer layer 5b).

Alternatively, in the case where the epitaxial substrate 10 is used as a substrate of a Schottky diode, one group-III nitride layer (for example, GaN layer) is formed as the functional layer 5.

Further, in the case where the epitaxial substrate 10 is used as a substrate of a light-emitting diode, an n-type nitride layer (for example, GaN layer), a light-emitting layer made of InAlGaN mixed crystals formed to have a compositional ratio corresponding to a target emission wavelength, a p-type nitride layer (for example, GaN layer) and the like are formed as the functional layer 5.

With the use of the epitaxial substrate 10 having the above-mentioned configuration, a semiconductor device having identical characteristics to those of the semiconductor device (such as Schottky diode or HEMT device) in which a group of group-III nitride layers is formed on a sapphire substrate or SiC substrate is achieved at a lower cost.

For example, in a concentric Schottky diode in which an anode and a cathode are disposed on the epitaxial substrate 10 including the functional layer 5 formed of GaN, a small leakage current and a high breakdown voltage are achieved.

Alternatively, in the case where the functional layer 5 is configured as an AlGaN/GaN laminated structure so as to be applied to a HEMT device, the functional layer 5 that is excellent in crystal quality and has high electron mobility is achieved.

<Method of Manufacturing Epitaxial Substrate>

Next, an outline of the method of manufacturing the epitaxial substrate 10 is described by taking a case of using the MOCVD method as an example.

First, a (111) plane single-crystal silicon wafer is prepared as the base substrate 1, a natural oxide film is removed by cleaning with dilute hydrofluoric acid, and then SPM cleaning is performed, to thereby obtain the state in which an oxide film having a thickness of approximately several Å is formed on the wafer surface. This is placed in the reactor of an MOCVD apparatus.

Then, respective layers are formed under predetermined heating conditions and gas atmosphere. First, the initial layer 3 made of AlN can be formed by introducing a trimethyl aluminum (TMA) bubbling gas that is an aluminum source and an $NH_3$ gas into a reactor at an appropriate molar flow rate and setting the deposition rate to 20 nm/min or more and a target film thickness to 200 nm or less in the state that the substrate temperature is kept at a predetermined initial layer formation temperature equal to 800° C. or higher and 1,200° C. or lower and the pressure inside the reactor is set to approximately 0.1 kPa to 30 kPa.

Note that in the case where the silicon wafer reaches an initial layer formation temperature, and then only a TMA bubbling gas is introduced into a rector to expose the wafer to a TMA bubbling gas atmosphere prior to the formation of the initial layer 3, the interface layer 2 made of $SiAl_xO_yN_z$ is formed.

The interlayer 4 is formed by, after the formation of the initial layer 3, introducing a trimethylgallium (TMG) bubbling gas that is a gallium source and an $NH_3$ gas, or further, a trimethylindium (TMI) bubbling gas that is an indium source or TMA bulling gas into the reactor at a predetermined flow rate corresponding to the composition of the interlayer 4 to be produced and causing $NH_3$ to react with at least one of TMI, TMA and TMG in the state that the substrate temperature is kept at a predetermined interlayer formation temperature of 800° C. or higher and 1,200° C. or lower and the pressure inside the reactor is set to 0.1 kPa to 100 kPa.

In the case of forming the superlattice structure layer 6, after the formation of the interlayer 4, a flow rate of an $NH_3$ gas and a group-III nitride source gas (bubbling gas of TMI, TMA or TMG) that are introduced into the reactor may be changed in an alternate manner corresponding to the compositions and film thicknesses of the first unit layer 6a and the second unit layer 6b, in the state that the substrate temperature is kept at a predetermined superlattice structure layer formation temperature of 800° C. or higher and 1,200° C. or lower and the pressure inside the reactor is set to 0.1 kPa to 100 kPa.

The functional layer 5 is formed by, after the formation of the interlayer 4 or the superlattice structure layer 6, introducing at least one of a TMI bubbling gas, a TMA bubbling gas and a TMG bubbling gas and an $NH_3$ gas into the reactor at a flow rate corresponding to the composition of the functional layer 5 to be produced and causing $NH_3$ to react with at least one of TMI, TMA and TMG in the state that the substrate temperature is kept at a predetermined functional layer formation temperature of 800° C. or higher and 1,200° C. or lower and the pressure inside the reactor is set to 0.1 kPa to 100 kPa. In the case where the functional layer 5 is composed of a plurality of layers having different compositions, as shown in FIG. 1, the fabrication conditions corresponding to the compositions of the respective layers are applied.

EXAMPLES

Example 1

In the present example, four types of epitaxial substrates 10 (sample names a-1 to a-4) were manufactured, with their conditions for forming the initial layer 3 differentiated. However, forming of the interface layer 2 and the superlattice structure layer 6 was omitted. FIG. 4 shows the conditions for forming an AlN layer (initial layer) and various evaluation results of the epitaxial substrates 10 according to Example 1.

First, a (111) plane single-crystal silicon wafer (hereinafter, silicon wafer) whose diameter was 4 inches and thickness was 525 μm was prepared as the base substrate 1. The silicon wafer prepared was subjected to cleaning with dilute hydrofluoric acid having the composition where hydrofluoric acid/pure water=1/10 (volume ratio) and SPM cleaning with a cleaning fluid having the composition where sulfuric acid/aqueous hydrogen peroxide=1/1 (volume ratio) to obtain the state that an oxide film having a thickness of several Å was formed on the wafer surface, and then this was placed in the reactor of the MOCVD apparatus. Then, the inside of the reactor was set to the mixed atmosphere of hydrogen and nitrogen, and heating was performed until the substrate temperature was equal to 1,050° C. being the initial layer formation temperature.

When the substrate temperature reached 1,050° C., an $NH_3$ gas was introduced into the reactor, and the substrate surface was exposed to the $NH_3$ gas atmosphere for one minute.

After that, the pressure inside the reactor was set to 10 kPa, the TMA bubbling gas was introduced into the reactor at a predetermined flow rate, and $NH_3$ and TMA were caused to react with each other, to thereby form the initial layer 3 having a surface of a three-dimensional asperity shape. On that occasion, the growth rate (deposition rate) of the initial layer 3 was set to 20 nm/min or 50 nm/min, and the target average film thickness of the initial layer 3 was set to 40 nm, 100 nm or 200 nm.

After the formation of the initial layer 3, then, the TMG bubbling gas was further introduced into the reactor with the substrate temperature set to 1,050° C. and the pressure inside the reactor set to 20 kPa, and the $Al_{0.3}Ga_{0.7}N$ layer as the interlayer 4 was formed to have an average film thickness of approximately 50 nm by the reaction of $NH_3$ with TMA and TMG.

The samples subjected to the process above were subjected to structure analysis by a transmission electron microscope (TEM) image and a high-angle annular dark-field (HAADF) image and, as a result, it was confirmed that an AlN layer being the initial layer 3 was deposited in the manner of having a three-dimensional surface asperity shape. In addition, it was confirmed that as shown in FIG. 4, the density of the convexities 3a was in the range of $5 \times 10^9 / cm^2$ or more and $5 \times 10^{10} / cm^2$ or less and the average interval of the convexities 3a was 45 nm or more and 140 nm or less. As a result of the measurement of the full width at half maximum of the X-ray rocking curve of the AlN layer, a value of 0.8 degrees (2,870 sec) or more was obtained in the (0002) plane as well as the (10-10) plane.

As a result of the evaluations of the dislocation density of the $Al_{0.3}Ga_{0.7}N$ layer, the dislocation density was approximately $1 \times 10^{11} / cm^2$ (screw dislocation was approximately $1 \times 10^{10} / cm^2$) as an average value of the entire layer, whereas on the surface of the $Al_{0.3}Ga_{0.7}N$ layer, the dislocation density was approximately $1 \times 10^{10} / cm^2$ (screw dislocation was approximately $2 \times 10^9 / cm^2$). That is, it was confirmed that a large number of dislocations were united and disappeared in the growth process of the AlGaN film.

Then, the substrate temperature was set to 1,050° C. and the pressure inside the reactor was set to 30 kPa, and TMG and $NH_3$ were caused to react with each other, to thereby form a GaN layer as the functional layer 5 to have a thickness of 800 nm. Accordingly, the epitaxial substrate 10 was obtained. In the epitaxial substrate 10 obtained, the group of group-III nitride layers formed on the silicon wafer had a total film thickness of 950 nm. No crack was found in the epitaxial substrate 10.

The dislocation density of the GaN layer of the obtained epitaxial substrate 10 was measured. As shown in FIG. 4, it was confirmed that the dislocation density was $5.7 \times 10^9 / cm^2$ (in that case, the density of screw dislocation was $1.8 \times 10^9 / cm^2$) at most, and that dislocations were fewer in the GaN layer than the $Al_{0.3}Ga_{0.7}N$ layer in any samples. Further, the full width at half maximum of the X-ray rocking curve of the GaN layer was measured, and then a value of 985 sec or less was obtained in the (0002) plane as well as the (10-10) plane.

Comparative Example 1

Four types of epitaxial substrates (sample names b-1 to b-4) were manufactured in similar conditions to those of Example 1 except for that the formation conditions of the initial layer 3 were determined so as not to satisfy at least one of the deposition rate of 20 nm/min or more and the target film thickness of 200 nm or less. Also as to Comparative Example 1, FIG. 4 shows the AlN layer formation conditions and various evaluation results of those epitaxial substrates 10.

Comparison Between Example 1 and Comparative Example 1

As shown in FIG. 4, the initial layer 3 was formed so as to have three-dimensional asperities in all samples in Example 1, whereas in Comparative Example 1, an initial layer was formed so as to have three-dimensional asperities only in the sample b-2. In particular, the sample b-4 had an extremely small full width at half maximum of the (0002) plane and a small degree of mosaicity. Further, three-dimensional asperities as sufficient as Example 1 were not obtained in b-2.

In the comparison of the GaN layer, no crack was found in every sample in Example 1, whereas a crack has occurred in the samples b-2 and b-4 of Comparative Example 1. In the comparison of the dislocation density and X-ray rocking curve full width at half maximum between the samples in which no crack was found, the dislocation density was smaller and the rocking curve full width at half maximum was smaller in the all samples of Example 1 compared with the samples b-2 and b-4 of Comparative Example 1.

The results above show that in the case of forming a group-III nitride semiconductor functional layer with a silicon substrate as a base substrate, it is effective to form an initial layer having predetermined three-dimensional asperities on a base substrate for improving the crystal quality of a functional layer.

Example 2

Four types of epitaxial substrates 10 (sample numbers a-5 to a-8) were manufactured in similar conditions and procedure to those of Example 1 except for that the interface layer 2 was provided. Also as to Example 2, FIG. 4 shows the AlN layer formation conditions and various evaluation results of those epitaxial substrates 10.

Specifically, at the time point when the substrate temperature reached 1,050° C. being an initial layer formation temperature, an NH$_3$ gas was introduced into the reactor, and the substrate surface was exposed to the NH$_3$ gas atmosphere for one minute. Then, differently from Example 1, supply of the NH$_3$ gas was stopped once, and a TMA bubbling gas was introduced into the reactor and the substrate surface was exposed to the TMA bubbling gas atmosphere for one minute. After that, the NH$_3$ gas was introduced into the reactor again, and thereafter, the initial layer 3, the interlayer 4 and the functional layer 5 were formed as in Example 1.

The samples in which the initial layer 3 was formed were subjected to structure analysis by TEM and HAADF images, and further, subjected to secondary ion mass spectrometory (SIMS) and composition analysis with an energy dispersive X-ray spectrometer (EDS). As a result, it was confirmed that the amorphous interface layer 2 made of SiAl$_x$O$_y$N$_z$ (merely referred to as SiAlON as well) having a film thickness of approximately 3 nm was formed on the AlN/Si interface, an AlN layer being the initial layer 3 was deposited on the interface layer 2 in a manner of having a three-dimensional surface asperity shape, N and O were diffused in the silicon wafer to make a solid solution, and Si and O were diffused in the AlN layer to make a solid solution.

As a result of the evaluations of the dislocation density of the Al$_{0.3}$Ga$_{0.7}$N layer, the dislocation density was approximately 1×10$^{11}$/cm$^2$ (screw dislocation was approximately 1×10$^{10}$/cm$^2$) as an average value of the entire layer, and on the surface of the Al$_{0.3}$Ga$_{0.7}$N layer, the dislocation density was approximately 1×10$^{10}$/cm$^2$ (screw dislocation was approximately 2×10$^9$/cm$^2$). That is, it was confirmed that a large number of dislocations were united and disappeared in the growth process of the AlGaN film also in Example 2.

Comparison Between Example 1 and Example 2

In Example 2 in which the interface layer 2 was provided, the state of convexities was identical to that of Example 1, but the X-ray rocking curve full width at half maximum of the (0002) plane of the AlN layer was smaller than that of Example 1. Further, as to the GaN layer, not only the X-ray rocking curve full width at half maximum of the (0002) plane but also the dislocation density was smaller compared with Example 1.

The results above show that owing to the provision of an interface layer, the initial layer whose crystal quality is improved while keeping a three-dimensional asperity shape is formed, which further improves the crystal quality of a functional layer.

Example 3, Example 4 and Comparative Example 2

As Example 3, five types of epitaxial substrates 10 (sample names a-9 to a-13) were manufactured in a similar procedure to that of Example 1 except for that the average film thickness of the Al$_{0.3}$Ga$_{0.7}$N layer being an interlayer was varied in the range of 40 nm or more. Note that a-10 is identical to a-2 of Example 1.

As Example 4, five types of epitaxial substrates 10 (sample names a-14 to a-18) were manufactured in a similar procedure to that of Example 3 except for that the interface layer 2 was provided. Note that a-15 is identical to a-6 of Example 2.

Further, as Comparative Example 2, three types of epitaxial substrates (sample names b-5 to b-7) were manufactured in a similar procedure to that of Example 1 except for that the average film thickness of the Al$_{0.3}$Ga$_{0.7}$N layer being an interlayer was varied in the range of smaller than 40 nm.

FIG. 5 shows the formed film thickness of the interlayer 4 and various evaluation results of the GaN layer being the functional layer 5 of the epitaxial substrates according to Example 3, Example 4 and Comparative Example 2.

It is confirmed from the results of Example 3 and the results of Comparative Example 2 shown in FIG. 5 that the formed film thickness of the interlayer 4 of 40 nm or more is effective for improving the crystal quality of the functional layer 5. In addition, as a result of the comparison between Example 3 and Example 4, the X-ray rocking curve full width at half maximum of the (0002) plane and the dislocation density are smaller in the samples of Example 4 in which the interface layer 2 is provided, similarly to the relationship between Example 1 and Example 2. Those results show that similar effects to those of Example 2 are achieved by providing the interface layer 2.

Example 5 and Example 6

As Example 5, four types of epitaxial substrates 10 (sample names a-19 to a-22) were manufactured in a similar procedure to that of Example 1 except for that the composition of the interlayer 4 was varied. Note that a-20 is identical to a-2 of Example 1.

As Example 6, four types of epitaxial substrates 10 (sample names a-23 to a-26) were manufactured in a similar procedure to that of Example 5 except for that the interface layer 2 was provided. Note that a-24 is identical to a-6 of Example 2.

FIG. 6 shows the composition of the interlayer and various evaluation results of the GaN layer being the functional layer of the epitaxial substrates 10 according to Example 5 and Example 6.

The results of Example 5 and Example 6 shown in FIG. 6 show that the effect of improving the crystal quality of the functional layer 5 in the epitaxial substrate 10 is obtained irrespective of the composition of the interlayer 4. In addition, also in the comparison between Example 5 and Example 6, the X-ray rocking curve full width at half maximum of the (0002) plane and the dislocation density are smaller in the samples of Example 6 in which the interface layer 2 is provided. Those results confirm the effects achieved by providing the interface layer 2.

Comparative Example 3

In the present comparative example, the epitaxial substrate including a sapphire substrate as a base substrate was manufactured.

First, a C-plane single-crystal sapphire wafer (hereinafter, sapphire wafer) was prepared as a base substrate. The sapphire wafer prepared was placed into the reactor of the MOCVD apparatus. Then, the inside of the reactor was set to the mixed atmosphere of hydrogen and nitrogen, and heating was performed until the substrate temperature was equal to 1,200° C. being the thermal cleaning temperature. After that, this was held for 10 minutes, and then the substrate temperature was lowered to 500° C.

When the substrate temperature reached 500° C., an $NH_3$ gas and a TMG bubbling gas were introduced into the reactor, and a GaN layer having a thickness of approximately 30 nm was formed as a so-called low-temperature GaN buffer layer.

After the formation of the low-temperature buffer layer, TMG and $NH_3$ were caused to react with each other with the substrate temperature set to 1,050° C. and the pressure inside the reactor set to 30 kPa, to thereby form a GaN layer corresponding to the functional layer 5 to have a thickness of 1 μm. Accordingly, the epitaxial substrate was obtained. No crack was found in the epitaxial substrate.

The dislocation density of the GaN layer of the obtained epitaxial substrate 10 was measured. The dislocation density was $2.5 \times 10^9 / cm^2$ (density of screw dislocation was $2 \times 10^8 / cm^2$).

Comparison Between Example 1 to Example 6 and Comparative Example 3

As a comparison between the total dislocation densities of the functional layers of the epitaxial substrates 10 according to Example 1 to Example 6 which are shown in FIG. 4 to FIG. 6 and the total dislocation density of the epitaxial substrate according to Comparative Example 3, values are larger in Example 1 to Example 6 but the orders thereof are the same. In particular, in the epitaxial substrates 10 according to Example 2, Example 4 and Example 6 in which the interface layer 2 is provided, a difference with Comparative Example 3 is extremely small such as 20% at most. In addition, as to the screw dislocation density, the values of the epitaxial substrates 10 according to Example 1 to Example 6 fall within the range of several times the value of the epitaxial substrate according to Comparative Example 3 at most.

Those results show that even in the case of using a silicon substrate cheaper than a sapphire substrate as a base substrate, it is possible to form a group-III nitride functional layer having the crystal quality comparable to that in the case of using a sapphire substrate.

Example 7 to Example 10 and Comparative Example 4

As Example 7 to Example 10, Schottky diodes were manufactured as semiconductor devices including the epitaxial substrate 10. In addition, as Comparative Example 4, a Schottky diode including an epitaxial substrate including a sapphire wafer as a base substrate was manufactured. FIG. 7 shows a layer configuration and various evaluation results of the epitaxial substrates according to Example 7 to Example 10 and Comparative Example 4.

In Example 7, the epitaxial substrate 10 formed in similar conditions and procedure to those of the sample a-2 of Example 1 was prepared.

In Example 8, the epitaxial substrate 10 formed in similar conditions and procedure to those of the sample a-6 of Example 2 was prepared as the epitaxial substrate 10 including the interface layer 2.

In Example 9, the epitaxial substrate 10 including the superlattice structure layer 6 was prepared. Specifically, the formation was performed similarly as in the case of the sample a-2 of Example 1 up to the formation of the $Al_{0.3}Ga_{0.7}N$ layer, and then, the pair layer in which the first unit layer 6a was a GaN layer and the second unit layer 6b was an AlN layer was formed for 40 periods, to thereby form the superlattice structure layer 6. On that occasion, a target film thickness of the AlN layer was 5 nm and a target film thickness of GaN was 20 nm. The obtained pair layers have a thickness of 1 μm. Then, a GaN layer as the functional layer 5 was formed to have a thickness of 1.5 μm on the obtained pair layers. The total film thickness of the respective layers formed on the silicon wafer was approximately 2.65 μm.

In Example 10, the epitaxial substrate 10 including the interface layer 2 as well as the superlattice structure layer 6 was prepared. Specifically, the formation was performed similarly as in the case of the sample a-6 of Example 2 up to the formation of the $Al_{0.3}Ga_{0.7}N$ layer, and then, the superlattice structure layer 6 and the GaN layer as the functional layer 5 were formed as in Example 9. The total film thickness of the respective layers formed on the silicon wafer was approximately 2.65 μm.

In Comparative Example 4, an epitaxial substrate including a sapphire wafer as a base substrate was prepared, which was formed in similar conditions and procedure to those of Comparative Example 3.

The dislocation densities of the GaN layers of the respective obtained epitaxial substrates were measured. As shown in FIG. 7, the dislocation densities of the respective examples were identical to the dislocation density of Comparative Example 4 in order, which were $5 \times 10^9 / cm^2$ at most, nearly equal to the sample a-2. Note that it was confirmed that in every example, dislocations are fewer in the GaN layer than the $Al_{0.3}Ga_{0.7}N$ layer, as in Example 1.

In any of Example 7 to Example 10 and Comparative Example 4, an epitaxial substrate was prepared, and then a Pt electrode as an anode electrode and a Ti/Al ohmic electrode as a cathode electrode were formed on the GaN layer by the photolithography process, to thereby obtain a concentric Schottky diode in which a distance between the electrodes was 10 μm.

As to the Schottky diodes according to Example 7 to Example 10, the leakage current when a voltage of 100 V was applied and the breakdown voltage being the voltage at which a breakdown occurs in a diode device were evaluated, as the reverse current-voltage characteristics, in the state that the silicon wafer and the cathode electrode were both connected to ground. As to the Schottky diode according to Comparative Example 4, the reverse current-voltage characteristics were evaluated in the state that the cathode electrode was connected to ground.

This resulted in that the leakage current and breakdown voltage in Example 7 were identical to Comparative Example 4 in value but other examples were more excellent than Comparative Example 4 in at least one of the leakage current and breakdown voltage, as shown in FIG. 7. Those results show that also in the case of using a silicon wafer, it is possible to produce a Schottky diode having characteristics equal to or higher than those in the case of using a sapphire wafer.

More specifically, the leakage current is reduced more in the case where the epitaxial substrate 10 includes the interface layer 2, compared with Comparative Example 4. Those results show that in the case of manufacturing a Schottky diode using the epitaxial substrate including a silicon wafer as a base substrate, it is possible to achieve a Schottky diode having a breakdown voltage nearly equal to one manufactured using a sapphire wafer and having reduced leakage current by providing an interface layer between a base substrate and an initial layer.

Further, from the results shown in FIG. 7, a higher breakdown voltage than that of Comparative Example 4 was obtained in the Schottky diodes according to Example 9 and Example 10 in which the epitaxial substrate 10 includes the superlattice structure layer 6. The results show that the formation of a superlattice structure layer has an effect of enhancing the breakdown voltage in the case where a Schottky diode is manufactured using an epitaxial substrate including a silicon wafer as a base substrate.

Example 11 to Example 14 and Comparative Example 5

As Example 11 to Example 14, epitaxial substrates 10 for HEMT devices were manufactured. Further, as Comparative Example 5, an epitaxial substrate for a HEMT device that includes a sapphire wafer as a base substrate was manufactured. FIG. 8 shows the layer configuration and various evaluation results of the epitaxial substrates according to Example 11 to Example 14 and Comparative Example 5.

In Example 11, the formation was performed up to the formation of the GaN layer serving as the functional layer 5 (channel layer 5a) in similar conditions and procedure to those of the sample a-2 of Example 1, and then TMA, TMG and $NH_3$ were introduced into the reactor with the substrate temperature set to 1,050° C. and the pressure inside the reactor set to 10 kPa, to thereby form an $Al_{0.2}Ga_{0.8}N$ layer as the functional layer 5 (barrier layer 5c) to have a thickness of 25 nm.

In Example 12, an epitaxial substrate including the interface layer 2 was prepared. Specifically, the formation was performed up to the formation of the GaN layer serving as the functional layer 5 (channel layer 5a) in similar conditions and procedure to those of the sample a-6 of Example 2, and then, an $Al_{0.2}Ga_{0.8}N$ layer was formed as in Example 1.

In Example 13, an epitaxial substrate including the superlattice structure layer 6 was prepared. Specifically, the formation was performed up to the formation of the GaN layer serving as the functional layer 5 (channel layer 5a) in a similar procedure to that of Example 9, and then, an $Al_{0.2}Ga_{0.8}N$ layer serving as the functional layer 5 (barrier layer 5c) was formed as in Example 11.

In Example 14, the epitaxial substrate 10 including the interface layer 2 as well as the superlattice structure layer 6 was prepared. Specifically, the formation was performed up to the formation of the $Al_{0.3}Ga_{0.7}N$ layer similarly to the sample a-6 of Example 2, and then, the formation was performed up to the formation of the superlattice structure layer 6 and a GaN layer serving as the functional layer 5 (channel layer 5a) as in Example 9. Further, an $Al_{0.2}Ga_{0.8}N$ layer serving as the functional layer 5 (barrier layer 5c) was formed as in Example 11.

In Comparative Example 5, a sapphire wafer was prepared as a base substrate, the formation was performed up to the formation of a GaN layer corresponding to the functional layer 5 (channel layer 5a) in similar conditions and procedure to those of Comparative Example 3, and an $Al_{0.2}Ga_{0.8}N$ layer as the functional layer 5 (barrier layer 5c) was formed as in Example 11, to thereby obtain an epitaxial substrate for a HEMT device.

An electron mobility and a two-dimensional electron density were measured as to the AlGaN/GaN laminated structure of the epitaxial substrates according to Example 11 to Example 14 and Comparative Example 5 manufactured in the procedure described above.

As shown in FIG. 8, hardly any difference was found between the respective examples and the comparative example except for that the electron mobility had a smaller value in Example 11 and Example 13 than the electron mobility of Comparative Example 5. Moreover, a difference of electron mobility is approximately several percent at most between Example 11 or Example 13 and Comparative Example 5. The results descried above show that also in a case of using a silicon wafer, it is possible to produce a HEMT device having nearly equal characteristics to those in the case of using a sapphire wafer.

In particular, nearly equal characteristics to those of Comparative Example 5 were obtained in Example 12 and Example 14 in which an interface layer was provided in an epitaxial substrate. Those results show that in the case of manufacturing a HEMT device using an epitaxial substrate including a silicon wafer as a base substrate, a HEMT device having nearly equal characteristics to those in the case of using a sapphire wafer can be manufactured by providing an interface layer between a base substrate and an initial layer.

The invention claimed is:

1. An epitaxial substrate for semiconductor device, in which a group of group-III nitride layers are formed on a base substrate of single-crystal silicon having a (111) orientation so that a (0001) crystal plane is approximately parallel to a surface of the base substrate, comprising:
   a first group-III nitride layer formed of AlN on said base substrate;
   a second group-III nitride layer formed of $In_{xx}Al_{yy}Ga_{zz}N$ ($xx+yy+zz=1$, $0 \leq xx<1$, $0 \leq yy<1$, and $0<zz \leq 1$) on said first group-III nitride layer; and
   at least one third group-III nitride layer epitaxially-formed on said second group-III nitride layer, wherein:
   said first group-III nitride layer is a layer containing multiple defects including at least one type of a columnar crystal, a granular crystal, a columnar domain and a granular domain; and
   an interface between said first group-III nitride layer and said second group-III nitride layer is a three-dimensional asperity surface.

2. The epitaxial substrate for semiconductor device according to claim 1, wherein an X-ray rocking curve full width at half maximum of a (0002) plane of said first group-III nitride layer is 0.8 degrees or more and 1.1 degrees or less and an X-ray rocking curve full width at half maximum of a (10-10) plane thereof is 0.8 degrees or more and 1.1 degrees or less.

3. The epitaxial substrate for semiconductor device according to claim 1, wherein an amorphous interface layer is formed between said base substrate and said first group-III nitride layer.

4. The epitaxial substrate for semiconductor device according to claim 3, wherein said interface layer is formed of $SiAl_xO_yN_z$.

5. The epitaxial substrate for semiconductor device according to claim 3, wherein a X-ray rocking curve full width at half maximum of a (0002) plane of said first group-III nitride layer is 0.5 degrees or more and 0.8 degrees or less.

6. The epitaxial substrate for semiconductor device according to claim 1, wherein when an average roughness of a 5 μm×5 μm area of a surface to be measured with an atomic force microscope is defined as a surface roughness, an interface between said second group-III nitride layer and said at least one third group-III nitride layer has a surface roughness of 4 nm or more and 12 nm or less.

7. The epitaxial substrate for semiconductor device according to claim 1, wherein said second group-III nitride layer is formed of $Al_{yy}Ga_{zz}N$ ($yy+zz=1$, $0 \leq yy<1$, and $0<zz \leq 1$).

8. The epitaxial substrate for semiconductor device according to claim 1, wherein convexities of said first group-III nitride layer has a density of $5 \times 10^9/cm^2$ or more and $5 \times 10^{10}/cm^2$ or less.

9. The epitaxial substrate for semiconductor device according to claim 1, wherein convexities of said first group-III nitride layer have an average interval of 45 nm or more and 140 nm or less.

10. The epitaxial substrate for semiconductor device according to claim 1, wherein said at least one third group-III nitride layer includes a functional layer of a semiconductor device.

11. The epitaxial substrate for semiconductor device according to claim 1, wherein said at least one third group-III nitride layer includes a superlattice structure layer obtained by periodically laminating two or more types of group-III nitride layers having different compositions directly on said second group-III nitride layer.

12. A semiconductor device comprising an epitaxial substrate, in which a group of group-III nitride layers are formed on a base substrate of single-crystal silicon having a (111) orientation so that a (0001) crystal plane is approximately parallel to a surface of the base substrate, said epitaxial substrate comprising:
  a first group-III nitride layer formed of AlN on said base substrate;
  a second group-III nitride layer formed of $In_{xx}Al_{yy}Ga_{zz}N$ (xx+yy+zz=1, 0≤xx<1, 0≤yy<1, and 0<zz≤1) on said first group-III nitride layer; and
  at least one third group-III nitride layer epitaxially-formed on said second group-III nitride layer, wherein:
  said first group-III nitride layer is a layer containing multiple defects including at least one type of a columnar crystal, a granular crystal, a columnar domain and a granular domain; and
  an interface between said first group-III nitride layer and said second group-III nitride layer is a three-dimensional asperity surface.

13. A method of manufacturing epitaxial substrate for semiconductor device, in which a group of group-III nitride layers is formed on a base substrate of single-crystal silicon having a (111) orientation so that a (0001) crystal plane is approximately parallel to a surface of said base substrate, said method comprising:
  a first formation step of forming a first group-III nitride layer of AlN on said base substrate;
  a second formation step of forming, on said first group-III nitride layer, a second group-III nitride layer of $In_{xx}Al_{yy}Ga_{zz}N$ (xx+yy+zz=1, 0≤xx<1, 0≤yy<1, and 0<zz≤1); and
  a third formation step of epitaxially-forming at least one third group-III nitride layer on said second group-III nitride layer,
  wherein in said first formation step, said first group-III nitride layer is formed as a layer containing multiple defects that includes at least one type of a columnar crystal, a granular crystal, a columnar domain and a granular domain and has a surface being a three-dimensional asperity surface.

14. The method of manufacturing epitaxial substrate for semiconductor device according to claim 13, wherein in said first formation step, said first group-III nitride layer is formed at a deposition rate of 20 nm/min. or more so as to have an average film thickness of 200 nm or less.

15. The method of manufacturing epitaxial substrate for semiconductor device according to claim 13, further comprising an interface layer formation step of forming an amorphous interface layer between said base substrate and said first group-III nitride layer.

16. The method of manufacturing epitaxial substrate for semiconductor device according to claim 15, wherein said interface layer is formed of $SiAl_xO_yN_z$.

17. The method of manufacturing epitaxial substrate for semiconductor device according to claim 13, wherein when an average roughness of a 5 μm×5 μm area of a surface to be measured with an atomic force microscope is defined as a surface roughness, in said second formation step, said second group-III nitride layer having a surface roughness of 4 nm or more and 12 nm or less is formed.

18. The method of manufacturing epitaxial substrate for semiconductor device according to claim 13, wherein in said second formation step, said second group-III nitride layer is formed of $Al_{yy}Ga_{zz}N$ (yy+zz=1, 0≤xx<1, and 0<zz≤1).

19. The method of manufacturing epitaxial substrate for semiconductor device according to claim 13, wherein said third formation step includes the step of forming a functional layer of a semiconductor device.

20. The method of manufacturing epitaxial substrate for semiconductor device according to claim 13, wherein said third formation step includes the step of periodically laminating two or more types of group-III nitride layers having different compositions directly on said second group-III nitride layer.

* * * * *